United States Patent
Lee et al.

(10) Patent No.: US 7,184,347 B2
(45) Date of Patent: Feb. 27, 2007

(54) SEMICONDUCTOR MEMORY DEVICES HAVING SEPARATE READ AND WRITE GLOBAL DATA LINES

(75) Inventors: Jae-Young Lee, Gyeonggi-do (KR); Chi Wook Kim, Gyeonggi-do (KR); Sung-Min Seo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/186,691

(22) Filed: Jul. 21, 2005

(65) Prior Publication Data

US 2006/0023483 A1 Feb. 2, 2006

(30) Foreign Application Priority Data

Jul. 30, 2004 (KR) ...................... 10-2004-0060610

(51) Int. Cl.
*G11C 7/02* (2006.01)
(52) U.S. Cl. .................. 365/207; 365/189.04
(58) Field of Classification Search ................ 365/207, 365/189.04, 230.06, 63
See application file for complete search history.

(56) References Cited

U.S. PATENT DOCUMENTS 6,272,056 B1 * 8/2001 Ooishi ........................ 365/200
6,396,732 B1 * 5/2002 Osada et al. ................ 365/156
6,956,780 B2 * 10/2005 Kyung ........................ 365/205

FOREIGN PATENT DOCUMENTS

| JP | 11-328965 | 11/1999 |
| JP | 2001-202782 | 7/2001 |
| JP | 2003-085996 | 3/2003 |
| JP | 2003-249097 | 9/2003 |
| KR | 1019990063603 | 7/2001 |

* cited by examiner

*Primary Examiner*—Anh Phung
(74) *Attorney, Agent, or Firm*—Myers Bigel Sibley & Sajovec

(57) ABSTRACT

Semiconductor memory devices include a memory cell array region having a plurality of memory cells, a local data I/O line pair that is electrically connected to the plurality of memory cells, a local sense amplifier that is electrically connected to the local data I/O line pair, a read global data I/O line pair that is electrically connected to the local sense amplifier and that is configured to transmit data during a read operation and a write global data I/O line pair that is electrically connected to the local sense amplifier that is configured to transmit data during a write operation.

14 Claims, 7 Drawing Sheets

SEMICONDUCTOR MEMORY DEVICES HAVING SEPARATE READ AND WRITE GLOBAL DATA LINES

CROSS-REFERENCE TO RELATED APPLICATION

This application claims priority under 35 U.S.C. § 119 from Korean Patent Application No. 2004-60610, filed Jul. 30, 2004, the disclosure of which is hereby incorporated herein by reference in its entirety.

FIELD OF THE INVENTION

The present invention relates to semiconductor memory devices and, more particularly, to semiconductor memory devices with improved I/O signal line arrangements and associated methods.

BACKGROUND OF THE INVENTION

As is well known to those of skill in the art, conventional semiconductor memory devices include a memory cell array region and a peripheral circuit region. The memory cell array region typically includes a plurality of memory cells, local sense amplifiers, local data I/O lines and global data I/O lines. The peripheral circuit region typically includes an I/O sense amplifier and a write driver. The global data I/O line in the memory cell array region is used during both a read operation and a write operation.

FIG. 1 is a schematic view illustrating the structure of a local data I/O line and a global data I/O line of a conventional semiconductor memory device.

In FIG. 1, reference numerals 10 and 20 denote a memory cell array region and a peripheral circuit region, respectively. LIO and LIOB denote a local data I/O line pair, GIO and GIOB denote a global data I/O line pair, RDIO and RDIOB denote a read data line pair, WDIO and WDIOB denote a write data line pair, LSA denotes a local sense amplifier, LGIOG denotes a local global I/O gate, DRV denotes a write driver, and IOSA denotes an I/O sense amplifier. The local global I/O gate LGIOG includes two transistors TR. The function and operation of the components of FIG. 1 are as follows.

During a read operation, the local sense amplifier LSA of the memory cell array region 10 amplifies a data signal of the local data I/O line pair LIO/LIOB and transmits it to an I/O sense amplifier IOSA in the peripheral circuit region 20 through the global data I/O line pair GIO/GIOB. The I/O sense amplifier IOSA amplifies the data signal transmitted through the global data I/O line pair GIO/GIOB and outputs it to the read data line pair RDIO/RDIOB. Likewise, during a write operation, the write driver DRV drives a data signal received through the write data line pair WDIO/WDIOB and outputs it to the global data I/O line pair GIO/GIOB. The data signal is provided to the local global I/O gate LGIOG via the global data I/O line pair GIO/GIOB, and the local global I/O gate LGIOG transmits this data signal to the local data I/O line pair LIO/LIOB.

In summary, during a read operation, the semiconductor memory device of FIG. 1 uses the local sense amplifier LSA to amplify a data signal carried by the local data I/O line pair LIO/LIOB. This amplified data signal is then transmitted to the peripheral circuit region 20 through the global data I/O line pair GIO/GIOB. During a write operation, the write driver DRV is used to drive a data signal carried by the write data line pair WDIO/WDIOB. This data signal is then transmitted through the global data I/O line pair GIO/GIOB to the local data I/O line pair LIO/LIOB of the memory cell array region 10 through the local global I/O gate LGIOG.

FIG. 2 is a circuit diagram illustrating the local sense amplifier and the local global I/O gate of the conventional semiconductor memory device of FIG. 1. The local sense amplifier LSA includes five transistors TR1 to TR5, and the local global I/O gate includes two transistors TR6 and TR7.

As is illustrated in FIG. 2, three transistors, TR1, TR4 and TR5, may be turned on or off in response to a read enable signal EN-R that is received from an external portion of the device. When the read enable signal EN-R is activated, the transistors TR1, TR4 and TR5 are each turned on, and the data signal carried by the local data I/O line pair LIO/LIOB is amplified by the local sense amplifier LSA and transmitted to the peripheral circuit region 20 through the global data I/O line pair GIO/GIOB.

The two transistors TR6 and TR7 may be turned on or off in response to a write enable signal EN-W that is also received from an external portion of the device. When the write enable signal EN-W is activated, the two transistors TR6 and TR7 are turned on, and thus a data signal received through the global data I/O line pair GIO/GIOB is transmitted to the local gate I/O line pair LIO/LIOB through the local global I/O gate LGIOG Thus, during a read operation, the local sense amplifier LSA of the semiconductor memory device of FIG. 2 amplifies the data signal carried by the local data I/O line pair LIO/LIOB and transmits the amplified data signal to the peripheral circuit region 20 through the global data I/O line pair GIO/GIOB in response to the read enable signal EN-R. During a write operation, the local global I/O gate LGIOG transmits data received from the peripheral circuit region 20 through the global data I/O line pair GIO/GIOB to the local data I/O line pair LIO/LIOB in response to the write enable signal EN-W.

FIG. 3 is a schematic diagram illustrating the arrangement of a local data I/O line pair LIO/LIOB and a global data I/O line pair GIO/GIOB in the conventional semiconductor memory device. In FIG. 3, LIO/LIOB denotes a local data I/O line pair, GIO/GIOB denotes a global data I/O line pair, WL denotes a word line, CSL denotes a column selecting signal line, LSA denotes a local sense amplifier, and LGIOG denotes a local global I/O gate. Non-cross-hatched lines are lines arranged on a first layer, while cross-hatched lines are lines arranged on a second layer. The arrangement of the local data I/O line pairs LIO/LIOB and the global data I/O line pairs GIO/GIOB in the conventional semiconductor memory device of FIG. 3 is explained below.

The word lines WL and the local data I/O line pairs LIO/LIOB are arranged on the first layer and extend in the same direction. The column selecting signal lines CSL and the global data I/O line pairs GIO/GIOB are arranged on the second layer, and are generally perpendicular to the word lines WL and to the local data I/O line pairs LIO/LIOB.

The conventional semiconductor memory device uses the driver DRV in the peripheral circuit region 20 to drive a data signal and transmit it through the global data I/O line pair GIO/GIOB during a write operation, thereby writing data to the memory cell. The conventional semiconductor memory device uses the local sense amplifier LSA to amplify the data stored in the memory cell and transmit it through the global data I/O line pair GIO/GIOB to the I/O sense amplifier IOSA in the peripheral circuit region 20 where it is sensed during a read operation.

SUMMARY OF THE INVENTION

Pursuant to embodiments of the present invention, semiconductor memory devices are provided that include a memory cell array region having a plurality of memory cells, a local data I/O line pair that is electrically connected to the plurality of memory cells, a local sense amplifier that is electrically connected to the local data I/O line pair, a read global data I/O line pair that is electrically connected to the local sense amplifier and a write global data I/O line pair that is electrically connected to the local sense amplifier.

The semiconductor memory devices may also include a peripheral circuit region that has an I/O sense amplifier that is electrically connected to the read global data I/O line pair and a write driver that is electrically connected to the write global data I/O line pair. The device may further include a word line that has a portion that is parallel to the lines of the local data I/O line pair and a column select line that is perpendicular to the word line and parallel to the read global data I/O line pair and to the write global data I/O line pair. The semiconductor memory device may also include a bit line sense amplifier that is coupled to at least one of the plurality of memory cells, a data I/O gate that is coupled between the local data I/O line pair and the bit line sense amplifier and a local global I/O gate coupled between the local data I/O line pair and the write global data I/O line pair.

In certain embodiments of the present invention, the read global data I/O line pair may comprise a first line having a first width and a second line having a second width. The write global data I/O line pair may comprise a third line having a third width and a fourth line having a fourth width. In these embodiments, the first and second widths are smaller than the third width. In some embodiments, the first width may be is approximately the same as the second width and the third width may be approximately the same as the fourth width.

In these or other embodiments, the capacitance of the read global data I/O line pair may be smaller than the capacitance of the write global data I/O line pair. Likewise, the resistance of the read global data I/O line pair may be greater than the resistance of the write global data I/O line pair.

In certain embodiments, the local data I/O line pair may be provided on a first layer of the device and both the read global data I/O line pair and the write global data I/O line pair may be provided on a second layer of the device that is different that the first layer. In other embodiments, the local data I/O line pair may be provided on a first layer of the device, the read global data I/O line pair may be provided on a second layer of the device and the write global data I/O line pair may be provided on a third layer of the device, where the first, second and third layers are each different layers. In still other embodiments, the word line and the local data I/O line pair may be provided on a first layer of the device and the column select line, the read global data I/O line pair and the write global data I/O line pair may be provided on one or more layers of the device other than the first layer. It will be appreciated that the first, second, third and other layers may be placed in any order in the device.

It will be appreciated that typically the semiconductor memory device will include a plurality of local data I/O line pairs, a plurality of sense amplifiers, a plurality of read global data I/O line pairs and a plurality of write global data I/O line pairs.

In some embodiments of the present invention, the read global data I/O line pair may be electrically connected to a read data line pair provided in a peripheral region of the semiconductor memory device and the write global data I/O line pair may be electrically connected to a write data line pair provided in the peripheral region of the semiconductor memory device.

Pursuant to further embodiments of the present invention, semiconductor memory devices are provided that include a word line and a column selecting signal line that is arranged perpendicular to the word line. These devices further include local data I/O line pairs that are arranged in the same direction as the word line, read global data I/O line pairs that are arranged in the same direction as the column selecting signal line and write global data I/O line pairs that are arranged in the same direction as the column selecting signal line.

The semiconductor memory device may include a plurality of layers. In certain embodiments, the word line and the local data I/O line pairs may be arranged on a first layer of the device, and the column selecting signal line and the read and write global data I/O line pairs may be arranged on one or more other layers that are different than the first layer. In other embodiments, the column selecting signal line and the read global data I/O line pairs may be located on different layers of the device, and the column selecting signal line and the write global data I/O line pairs may be located on different layers of the device. In still further embodiments, the read global data I/O line pairs and the column selecting signal line may be arranged on a second layer of the device, and the write global data I/O line pairs may be arranged on a layer of the device other than the second layer. In yet further embodiments, the write global data I/O line pairs and the column selecting signal line may be arranged on a second layer of the device, and the read global data I/O line pairs may be arranged on a layer of the device other than the second layer.

Pursuant to still further embodiments of the present invention, methods of operating a semiconductor memory device that includes a memory cell, a local data I/O line pair that is electrically connected to the memory cell, a sense amplifier that is electrically connected to the local data I/O line pair, a read global data I/O line pair that is electrically connected to the local sense amplifier and a write global data I/O line pair that is electrically connected to the local sense amplifier are provided. Pursuant to these methods, a data bit is written to the memory cell via the write global data I/O line pair. Thereafter, the data bit is read from the memory cell via the read global data I/O line pair.

Embodiments of the present invention further provide methods of arranging a data line of a semiconductor memory device having a word line and a column selecting signal line arranged in a perpendicular direction to the word line, comprising: arranging local data I/O line pairs in the same direction as the word line; arranging read global data I/O line pairs in the same direction as the column selecting signal line and transmitting data during a read operation; and arranging write global data I/O line pairs in the same direction as the column selecting signal line which transmits data during a write operation.

The word line and the local data I/O line pairs may be arranged on the same layer, and the column selecting signal line and the read and write global data I/O line pairs may be arranged on a different layer from the word line and the local data I/O line pairs.

The column selecting signal line and the read and write global data I/O line pairs may be arranged on a different layer from each other.

The read global data I/O line pairs and the column selecting signal line may be arranged on the same layer, and the write global data I/O line pairs may be arranged on a different layer from the read global data I/O line pairs and the column selecting signal line.

The write global data I/O line pairs and the column selecting signal line may be arranged on the same layer, and the read global data I/O line pairs may be arranged on a different layer from the write global data I/O line pairs and the column selecting signal line.

Some of the read and write global data I/O line pairs and the column selecting signal line may be arranged on the same layer, and the rest of the read and write global data I/O line pairs may be arranged on a different layer from the column selecting signal line.

All or some of the read and write global data I/O line pairs may be arranged on different layers from each other, and lines which transmit the same signal are connected.

The write global data I/O line pair may be wider in width than the read data line pair.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF THE INVENTION

Figure 1:
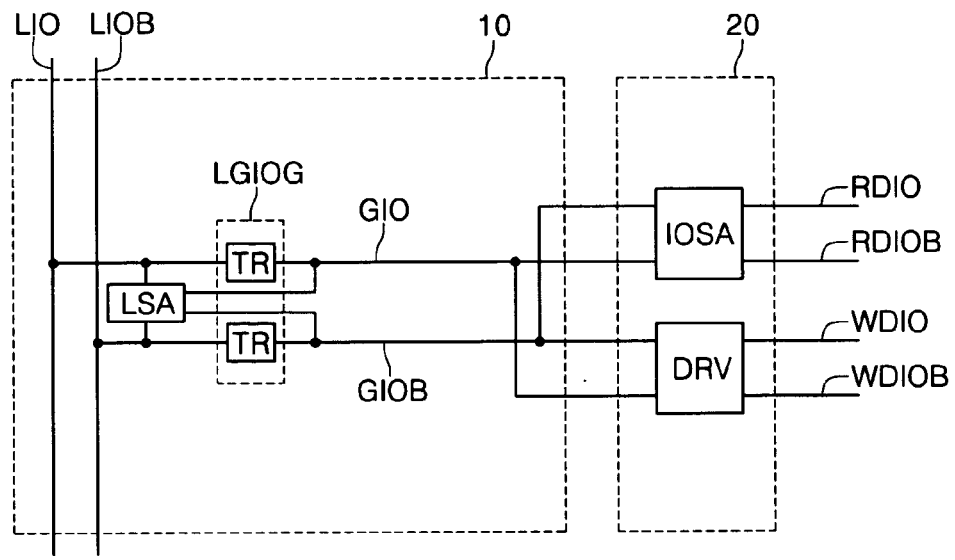
FIG. 1 is a schematic diagram illustrating the structure of a local data I/O line and of a global data I/O line in a conventional semiconductor memory device.
Figure 2:
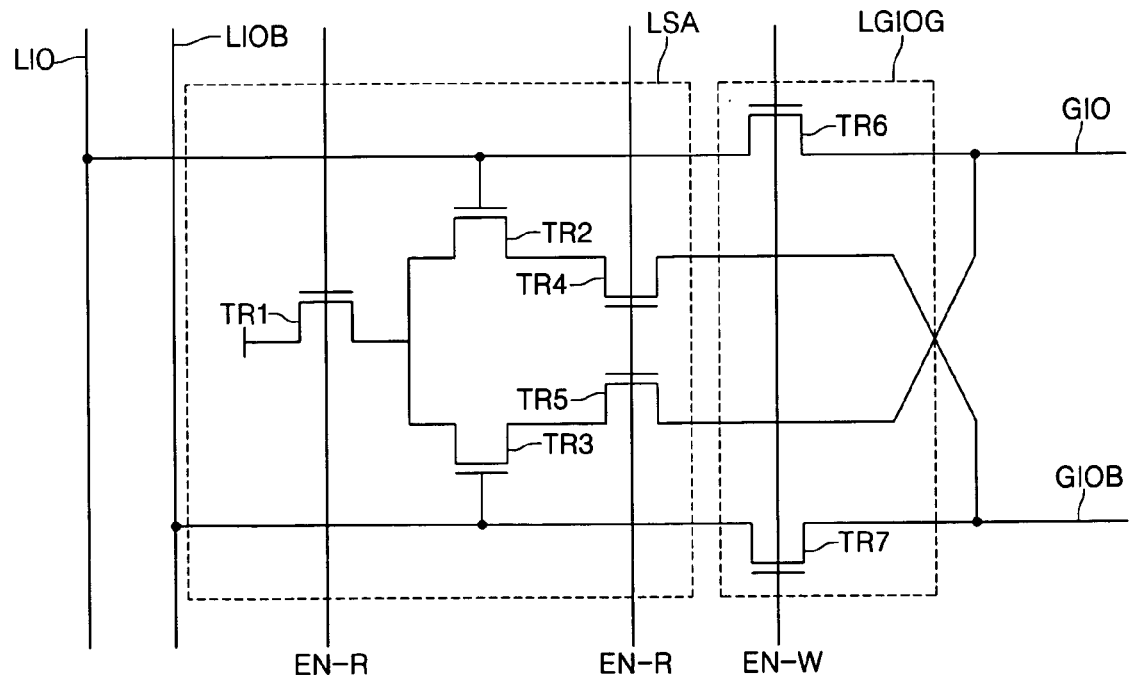
FIG. 2 is a circuit diagram illustrating a local sense amplifier and a local global I/O gate of the conventional semiconductor memory device of FIG. 1.
Figure 3:
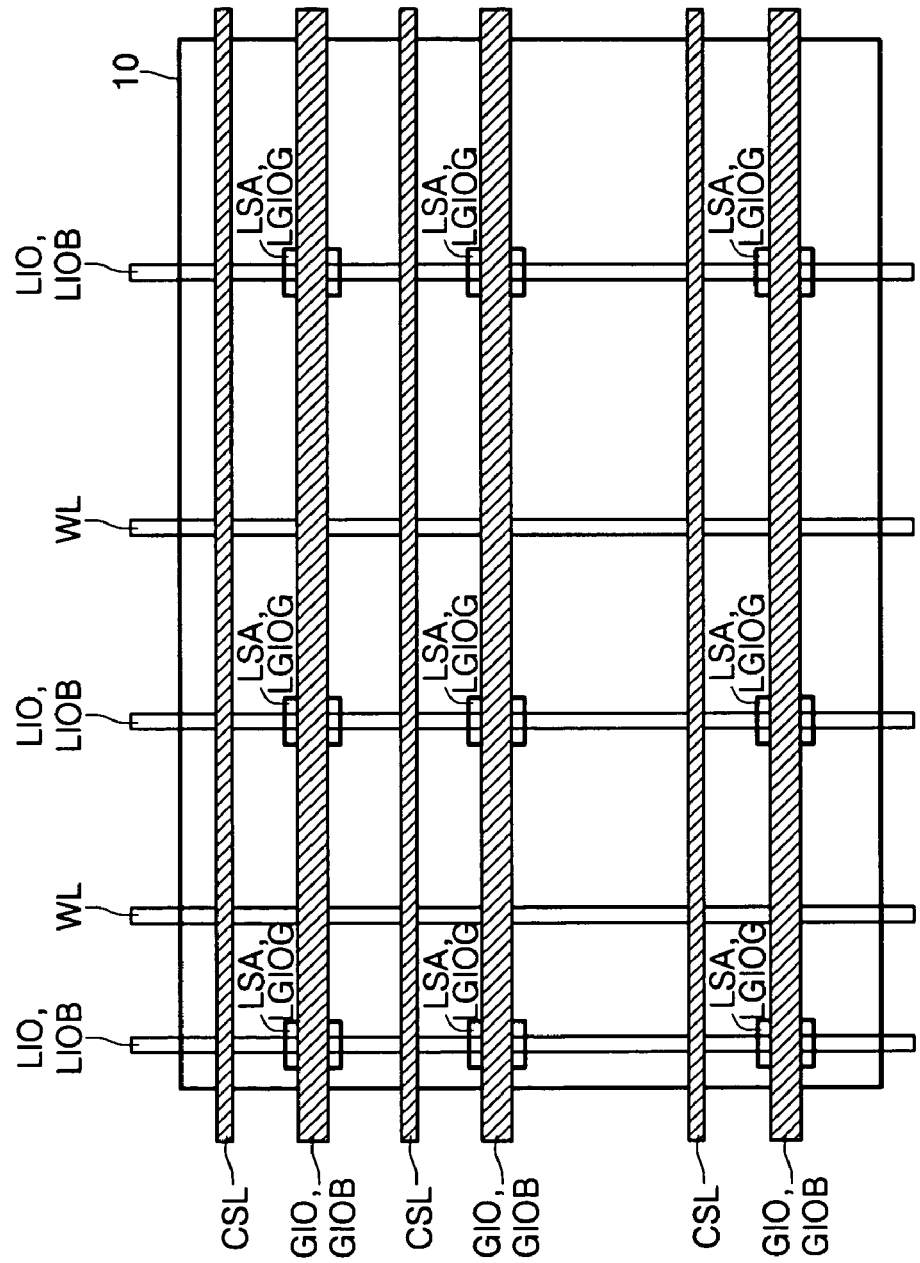
FIG. 3 is a schematic diagram illustrating an arrangement of a local data I/O line pair LIO/LIOB and a global data I/O line pair GIO/GIOB in a conventional semiconductor memory device.

Embodiments of the present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element to another element as illustrated in the FIGS. It will be understood that these terms are intended to encompass different orientations of the device in addition to the orientation depicted in the FIGS.

Embodiments of the invention are described herein with reference to schematic illustrations of idealized embodiments (and intermediate structures) of the invention. The shape and size of elements in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the FIGS. are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
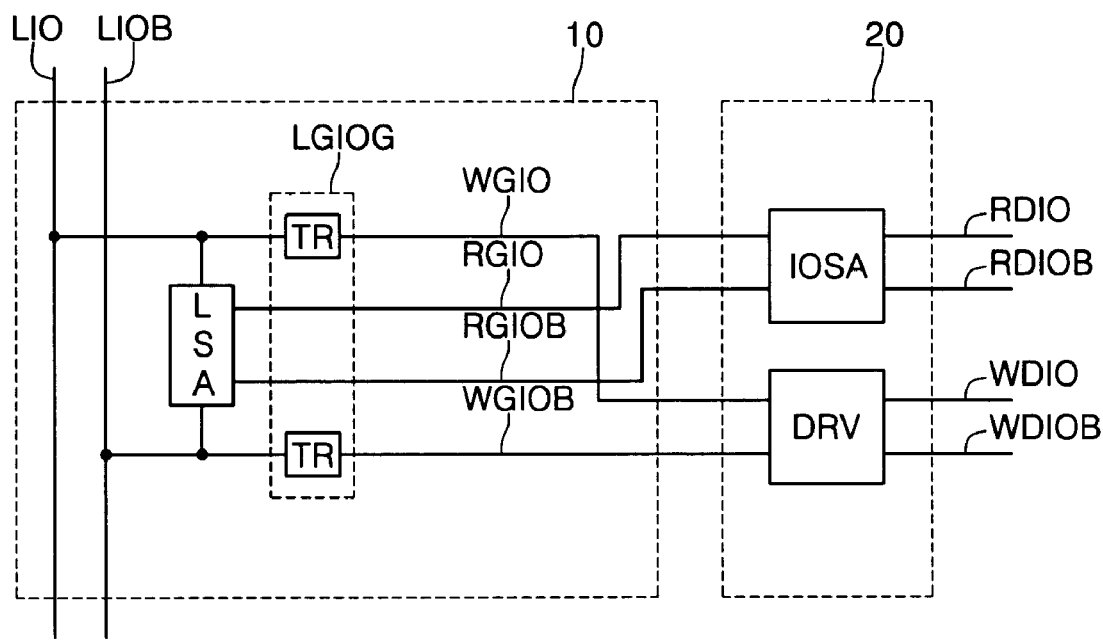
FIG. 4 is a schematic diagram illustrating the structure of a local data I/O line and a global data I/O line in a semiconductor memory device according to certain embodiments of the present invention.

FIG. 4 is a schematic diagram illustrating the structure of the local data I/O lines and the global data I/O lines of a semiconductor memory device according to certain embodiments of the present invention. In FIG. 4, reference numerals 10 and 20 denote a memory cell array region and a peripheral circuit region, respectively, and LIO/LIOB denotes a local data I/O line pair, RDIO/RDIOB denotes a read data line pair, WDIO/WDIOB denotes a write data line pair, LSA denotes a local sense amplifier, LGIOG denotes a local global I/O gate, DRV denotes a write driver, and IOSA denotes an I/O sense amplifier. The local global I/O gate LGIOG includes two transistors TR. The function and operation of the components of FIG. 4 are explained below.

During a read operation, the local sense amplifier LSA of the memory cell array region 10 amplifies a data signal carried by the local data I/O line pair LIO/LIOB and transmits the amplified data signal to the peripheral circuit region 20 through the read global data I/O line pair RGIO/RGIOB. The I/O sense amplifier IOSA in the peripheral region then amplifies the data signal received via the read global data I/O line pair RGIO/RGIOB and outputs it to an external portion of the semiconductor memory device through the read data line pair RDIO/RDIOB. During a write operation, the write driver DRV drives a data signal received from an external portion of the device through the write data line pair WDIO/WDIOB and outputs it to the memory cell region 10 through the write global data I/O line pair WGIO/WGIOB. The local global I/O gate LGIOG receives the data signal from the write global data I/O line pair WGIO/WGIOB and then transmits it to the local data I/O line pair LIO/LIOB.

Thus, during a read operation, the semiconductor memory device of FIG. 4 may be used to transmit a data signal that is amplified by the local sense amplifier LSA to the peripheral circuit region 20 through the read global data I/O line pair RGIO/RGIOB. During a write operation, the semiconductor memory device may be used to transmit a data signal that is amplified by the write driver DRV to the local data I/O line pair LIO/LIOB of the memory cell array region 10 through the write global data I/O line pair WGIO/WGIOB and the local global I/O gate LGIOG. Thus, the semiconductor memory device of FIG. 4 uses different global data I/O line pairs for read and write operations. As such, the width of the respective global data I/O line pairs may be designed to have improved characteristics for read and write operations.

Figure 5:
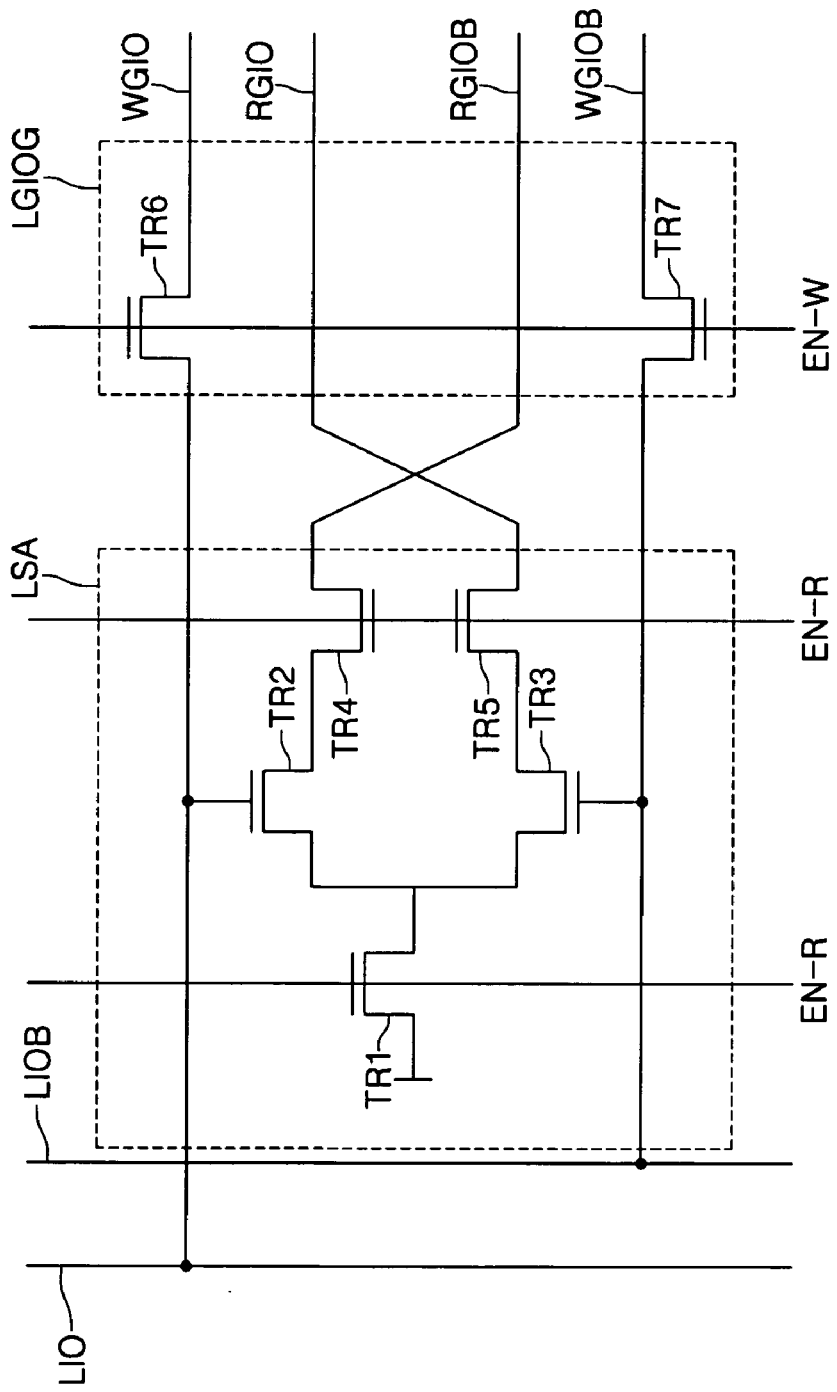
FIG. 5 is a circuit diagram illustrating the local sense amplifier LSA and the local global I/O gate LGIOG of the semiconductor memory device of FIG. 4.

FIG. 5 is a circuit diagram illustrating an embodiment of the local sense amplifier LSA and the local global I/O gate LGIOG of the semiconductor memory device of FIG. 4. In the embodiment depicted in FIG. 5, the local sense amplifier LSA includes five transistors TR1 to TR5, and the local global I/O gate includes two transistors TR6 and TR7. Operation of the circuit of FIG. 5 is explained below.

Three transistors TR1, TR4 and TR5 are turned on or off in response to a read enable signal EN-R that is input from an external portion of the circuit. When the three transistors TR1, TR4 and TR5 turn on in response to activation of the read enable signal EN-R, the local sense amplifier LSA operates. As a result, a data signal carried by the local data I/O line pair LIO/LIOB is amplified by the local sense amplifier LSA and transmitted to the peripheral circuit region 20 through the read global data I/O line pair RGIO/RGIOB.

The transistors TR6 and TR7 are turned on or off in response to a write enable signal EN-W that is input from an external portion of the device. When the transistors TR6 and TR7 are turned on in response to activation of the write enable signal EN-W, a data signal carried by the write global data I/O line pair WGIO/WGIOB is transmitted to the local gate I/O line pair LIO/LIOB.

In summary, during a read operation, in response to the read enable signal EN-R, the local sense amplifier LSA amplifies the data signal carried by the local data I/O line pair LIO/LIOB and transmits the amplified data signal to the peripheral circuit region 20 through the read global data I/O line pair RGIO/RGIOB. During a write operation, the local global I/O gate LGIOG transmits data carried by the write global data I/O line pair WGIO/WGIOB to the local data I/O line pair LIO/LIOB in response to the write enable signal EN-W. Thus, the semiconductor memory device according to embodiments of the present invention transmits a data signal through the read global data signal line pair RGIO/RIOB during a read operation, and transmits a data signal through the write global data signal line pair WGIO/WGIOB during a write operation.

Figure 6:
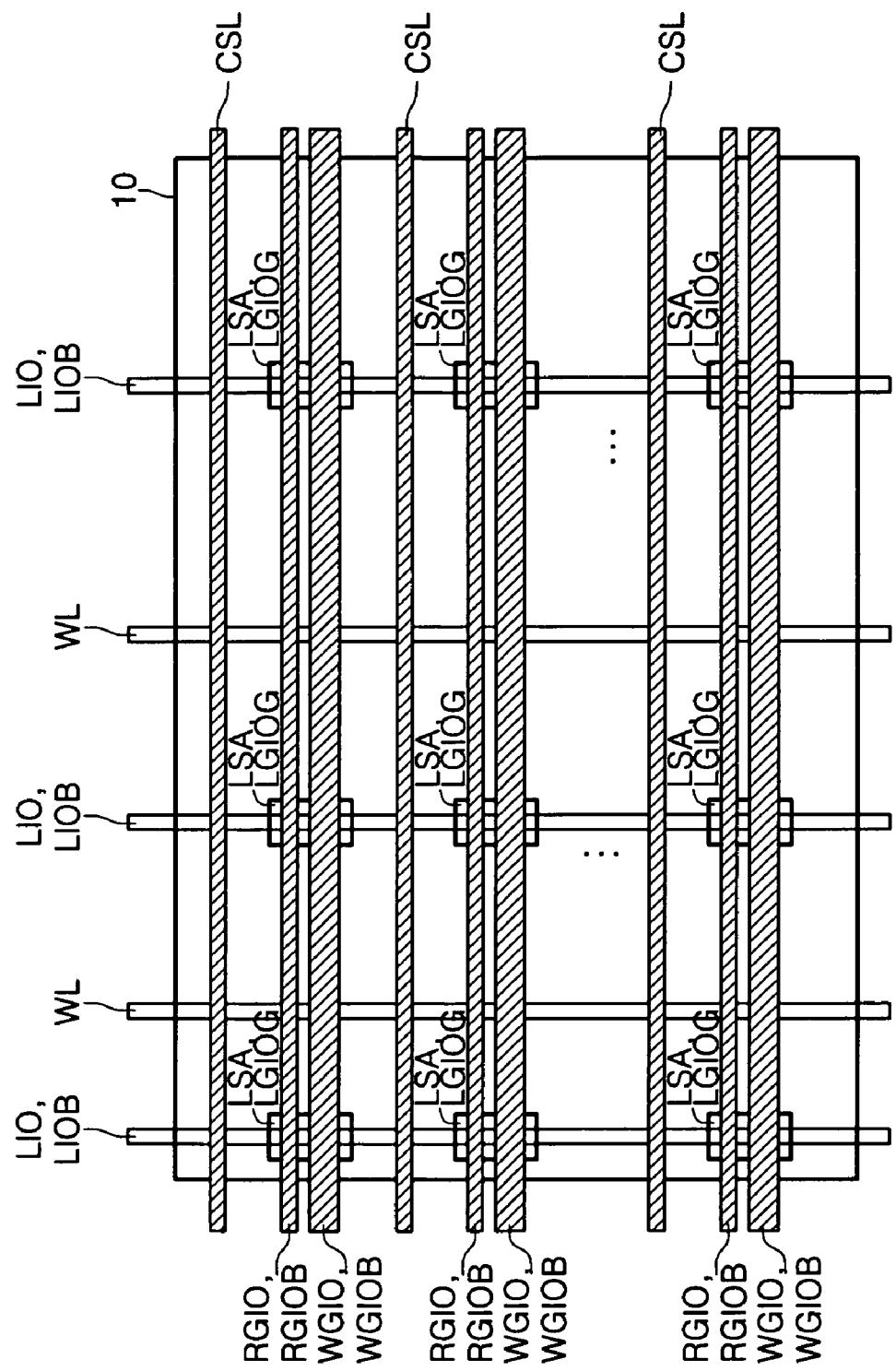
FIG. 6 is a schematic diagram illustrating an arrangement of data I/O lines according to some embodiments of the present invention.

FIG. 6 is a schematic diagram illustrating an arrangement of a data I/O line of the semiconductor memory device according to some embodiments of the present invention. In FIG. 6, LIO/LIOB denotes a local data I/O line pair, RGIO/RGIOB denotes a read global data I/O line pair, WGIO/WGIOB denotes a write global data I/O line pair, WL denotes a word line, CSL denotes a column selecting signal line, LSA denotes a local sense amplifier, and LGIOG denotes a local global data I/O gate. The non-cross hatched lines in FIG. 6 may be on a first layer, and the cross-hatched lines may be on a second layer.

As shown in FIG. 6, the word line WL and the local data I/O line pair LIO/LIOB may be arranged to run in the same direction on the first layer, and the column selecting signal line CSL, the read global data I/O line pair RGIO/RGIOB, and the write global data I/O line pair WGIO/WGIOB may be arranged on the second layer in a direction perpendicular to the local data I/O line pair LIO/LIOB. As is also shown in FIG. 6, according to embodiments of the present invention, the write global data I/O line pair WGIO/WGIOB may be designed to have a wider width than the read global data I/O line pair RGIO/RGIOB.

In certain semiconductor memory devices, the local sense amplifiers LSA used during the read operations may be relatively small in size due to spatial constraints within the memory cell array. As such, the local sense amplifiers may have a relatively small drivable electrical current. In contrast, the driver DRV used during a write operation can often be relatively large and therefore may have a larger drivable electrical current. Since a capacitance component of the global data I/O line may have a primary impact on signals transmitted through the global data I/O lines during a read operation, the signal transmission characteristics of the global data I/O line may, in certain embodiments of the present invention, be improved by reducing the signal line width of the global data I/O lines in order to reduce the capacitance component. In contrast, since a resistive component of the global data I/O line may have a primary impact on signals transmitted during a write operation, the signal transmission characteristics of the global data I/O line may be improved according to embodiments of the present invention by increasing the signal line width of the global data I/O lines in order to reduce the resistive component. Thus, pursuant to embodiments of the present invention, read global data I/O lines and write global data I/O lines may be provided that have line widths that may operate well in both read and write operations.

Thus, in certain embodiments of the present invention, the read global data I/O line pair RGIO/RGIOB and the write global data I/O line pair WGIO/WGIOB may be arranged on the same layer as the column selecting signal line CSL, and the respective widths of the read global data I/O line pair RGIO/RGIOB and the write global data I/O line pair WGIO/WGIOB may be designed based on the desired characteristics of those lines, which may provide for improved device performance.

Figure 7:
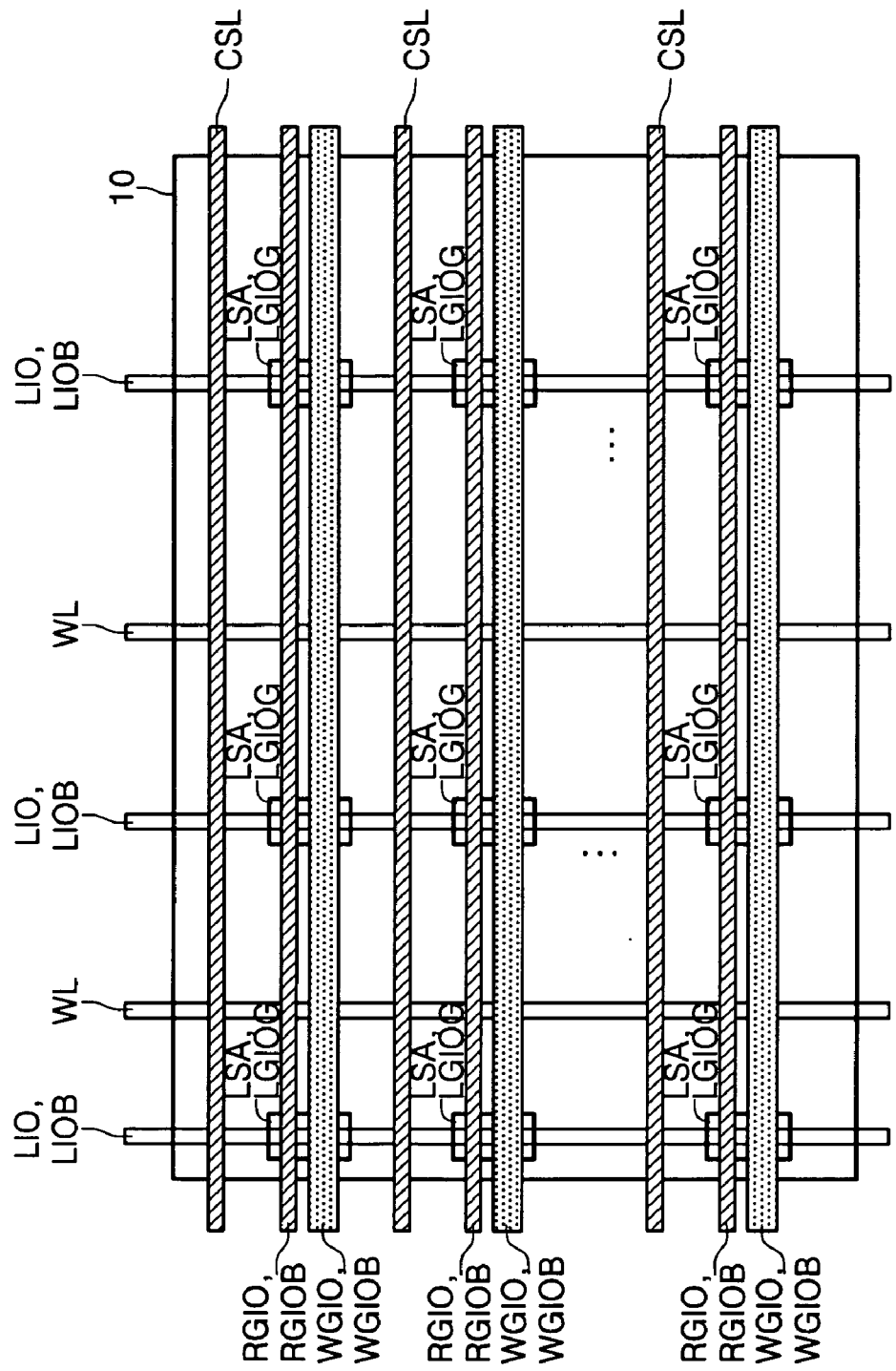
FIG. 7 is a schematic diagram illustrating an arrangement of data I/O lines according to further embodiments of the present invention.

FIG. 7 is a schematic diagram illustrating an arrangement of certain data I/O lines in a semiconductor memory devices according to further embodiments of the present invention. Like reference indicators in FIGS. 6 and 7 denote like parts. Non-cross hatched lines denote lines arranged on a first layer, cross hatched lines denote lines arranged on a second layer, and dot-filled lines denote lines arranged on a third layer.

As shown in FIG. 7, the word line WL and the local data I/O line pair LIO/LIOB may be arranged in the same direction on a first layer, the column selecting signal line CSL and the read global data I/O line pair RGIO/RGIOB may be arranged on a second layer in a direction perpendicular to the local data I/O line pair LIO/LIOB, and the write global data I/O line pair WGIO/WGIOB may be arranged on a third layer in a direction perpendicular to the local data I/O line pair LIO/LIOB. Moreover, the write global data I/O line pair WGIO/WGIOB may have a wider width than the read global data I/O line pair RGIO/RGIOB.

Numerous other arrangements of the I/O data lines are also possible. For example, the embodiment of the present invention depicted in FIG. 7 may be modified such that the column selecting signal line CSL and the write global data I/O line pairs WGIO/WGIOB are provided on the second layer and the read global data I/O line pairs RGIO/RGIOB are provided on the third layer. In still further embodiments, some of the read global data I/O line pairs RGIO/RGIOB and write global data I/O line pairs WGIO/WGIOB may be provided on the second layer along with the column selecting signal line CSL, while the remainder of the read global data I/O line pairs RGIO/RGIOB and the write global data I/O line pairs WGIO/WGIOB are provided on the third layer. In still further embodiments, the column selecting signal line CSL may be provided on the second layer and the read and write global data I/O line pairs RGIO/RGIOB and WGIO/WGIOB may be provided on one or more additional layers. In yet additional embodiments of the present invention, the read global data I/O line pairs RGIO/RGIOB and the write global data I/O line pairs WGIO/WGIOB may be provided on a plurality of layers. That is, the data I/O lines may be implemented to get a desired resistance value by arranging lines which transmit the same signal on a plurality of layers and reducing a line width of lines arranged on respective layers. It will be appreciated that further arrangements are also possible.

The semiconductor memory devices according to embodiments of the present invention can provide improved performance since the read global data I/O line pairs RGIO/RGIOB used for read operations and the write global data I/O line pairs WGIO/WGIOB used for write operations may be separately arranged and thus it is possible to provide these lines having a line width that may be designed for respective line characteristics.

Figure 8:
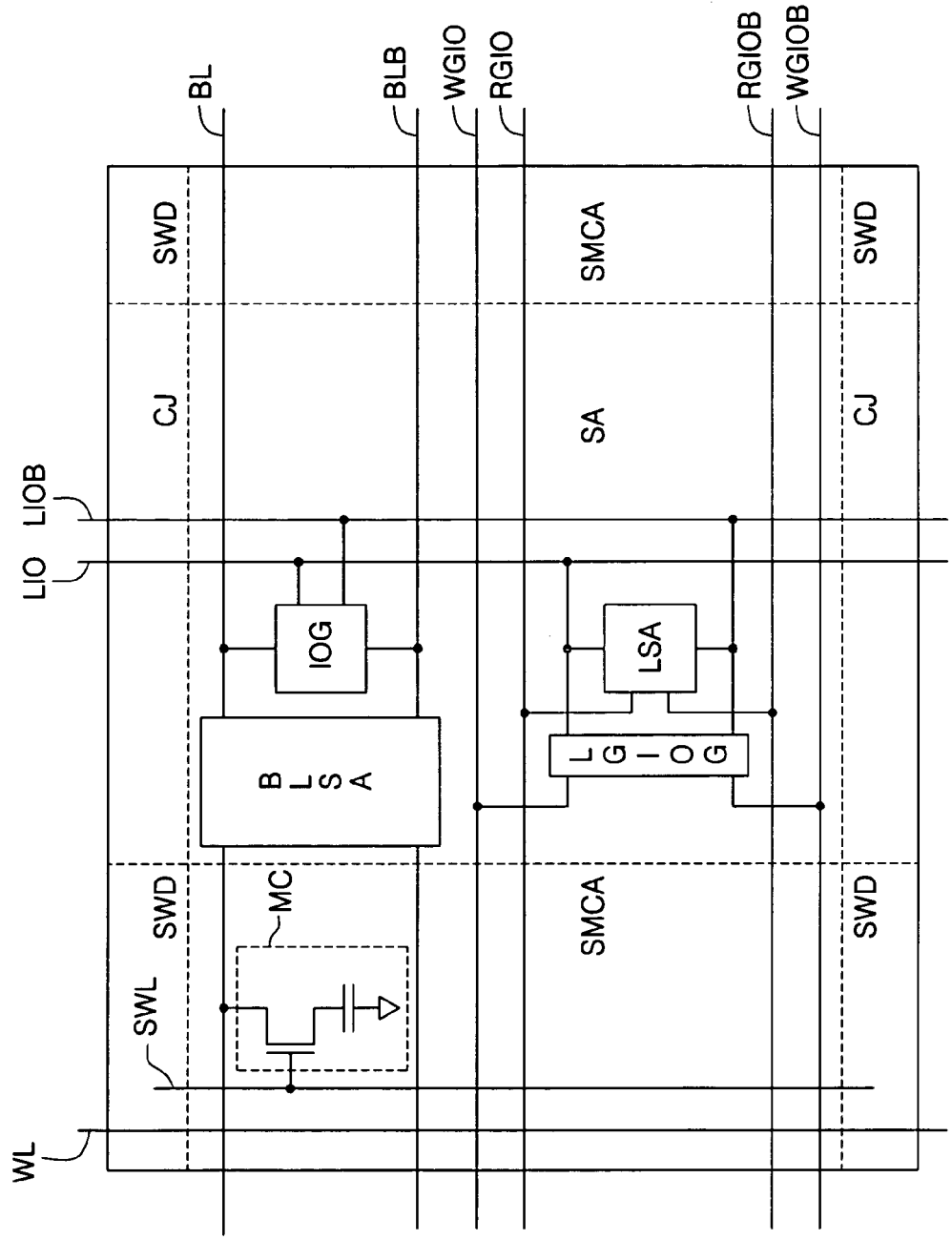
FIG. 8 is a block diagram illustrating the configuration of a semiconductor memory device which employs an arrangement of data I/O lines according to embodiments of the present invention.

FIG. 8 is a block diagram illustrating a configuration of a semiconductor memory device which employs a data I/O line arrangement according to certain embodiments of the present invention. In FIG. 8, CJ denotes a conjunction block, SWD denotes a sub word line driver block, SA denotes a sense amplifier block, and SMCA denotes a sub memory cell block. Likewise, in FIG. 8, WL denotes a word line, SWL denotes a sub word line, LIO/LIOB denotes a local data I/O line pair, BL/BLB denotes a bit line pair, RGIO/RGIOB denotes a read global data I/O line pair, WGIO/WGIOB denotes a write global data I/O line pair, MC denotes a memory cell of the sub memory cell array block SMCA, BLSA denotes a bit line sense amplifier, IOG denotes a data I/O gate, LSA denotes a local sense amplifier, and LGIOG denotes a local global I/O gate.

In FIG. 8, the memory cell MC in the sub memory cell array block SMCA is arranged adjacent the sub word line SWL and the bit line BL. The sub word line SWL is arranged in the same direction as the word line WL. The bit line sense amplifier BLSA is provided between the bit lines of the bit line pair BL/BLB and may be used to amplify the level of the signal carried on the bit line pair BL/BLB. The data I/O gate IOG which transmits data is arranged between the bit line pair BL/BLB and the local data I/O line pair LIO/LIOB. The local sense amplifier LSA, which amplifies the data signal carried by the local data I/O line pair LIO/LIOB during a read operation, is provided between the local data I/O line pair LIO/LIOB and the read global data I/O line pair RGIO/RGIOB. The local global I/O gate LGIOG, which transmits the data signal carried by the write global data I/O line pair WGIO/WGIOB to the local data I/O line pair LIO/LIOB during a write operation, is provided between the local data I/O line pair LIO/LIOB and the write global data I/O line pair WGIO/WGIOB.

Pursuant to embodiments of the present invention, semiconductor memory devices are provided which include a local sense amplifier LSA that outputs a data signal to the read global data I/O line pair RGIO/RGIOB during a read operation and that includes a local global I/O gate LGIOG that transmits a data signal from the write global data I/O line pair WGIO/WGIOB to the local data I/O line pair LIO/LIOB during a write operation. It will also be appreciated that the method of arranging the data I/O line according to embodiments of the present invention can be applied to a semiconductor memory device having various other configurations as well as the semiconductor memory device described above.

As described above, according to embodiments of the present invention, semiconductor memory devices and methods of arranging the data I/O lines in such devices may be provided in which the read global data I/O line pair RGIO/RGIOB used for a read operation and the write global data I/O line pair WGIO/WGIOB used for a write operation are provided separately.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor memory device, comprising:
   a memory cell array region having a plurality of memory cells;
   a local data I/O line pair that is electrically connected to the plurality of memory cells;
   a local sense amplifier that is electrically connected to the local data I/O line pair;
   a read global data I/O line pair that is electrically connected to the local sense amplifier and that is configured to transmit data during a read operation; and
   a write global data I/O line pair that is electrically connected to the local sense amplifier that is configured to transmit data during a write operation.

2. The semiconductor memory device of claim 1, further comprising a peripheral circuit region having an I/O sense amplifier that is electrically connected to the read global data I/O line pair and a write driver that is electrically connected to the write global data I/O line pair.

3. The semiconductor memory device of claim 2, wherein the resistance of the read global data 110 line pair is greater than the resistance of the write global data I/O line pair.

4. The semiconductor memory device of claim 2, further comprising:
a word line that includes a portion that is parallel to the lines of the local data I/O line pair; and
a column select line that is perpendicular to the word line and parallel to the read global data I/O line pair and to the write global data I/O line pair.

5. The semiconductor memory device of claim 4, wherein the semiconductor memory device comprises a plurality of layers, and wherein the word line and the local data I/O line pair are provided on a first layer of the device and the column select line, the read global data 110 line pair and the write global data I/O line pair are provided on one or more layers of the device other than the first layer.

6. The semiconductor memory device of claim 4, further comprising:
a bit line sense amplifier coupled to at least one of the plurality of memory cells;
a data I/O gate coupled between the local data I/O line pair and the bit line sense amplifier; and
a local global I/O gate coupled between the local data I/O line pair and the write global data I/O line pair.

7. The semiconductor memory device of claim 1, wherein the read global data I/O line pair comprises a first line having a first width and a second line having a second width, and the write global data I/O line pair comprises a third line having a third width and a fourth line having a fourth width, and wherein the first and second widths are smaller than the third width.

8. The semiconductor memory device of claim 7, wherein the first width is approximately the same as the second width and the third width is approximately the same as the fourth width.

9. The semiconductor memory device of claim 1, wherein the capacitance of the read global data I/O line pair is smaller than the capacitance of the write global data I/O line pair.

10. The semiconductor memory device of claim 1, wherein the local data I/O line pair is provided on a first layer of the device and both the read global data I/O line pair and the write global data I/O line pair are provided on a second layer of the device that is different than the first layer.

11. The semiconductor memory device of claim 1, wherein the local data I/O line pair is provided on a first layer of the device, the read global data I/O line pair is provided on a second layer of the device and the write global data I/O line pair is provided on a third layer of the device, wherein the first, second and third layers are each different layers.

12. The semiconductor memory device of claim 1, wherein the semiconductor memory device comprises a plurality of local data I/O line pairs, a plurality of sense amplifiers, a plurality of read global data I/O line pairs and a plurality of write global data I/O line pairs.

13. The semiconductor memory device of claim 1, wherein the read global data I/O line pair is electrically connected to a read data line pair provided in a peripheral region of the semiconductor memory device and wherein the write global data I/O line pair is electrically connected to a write data line pair provided in the peripheral region of the semiconductor memory device.

14. The semiconductor memory device of claim 1, wherein the local sense amplifier comprises:
a first transistor having a source/drain region coupled to a first line of the read global data I/O line pair;
a second transistor having a source/drain region coupled to a second line of the read global data I/O line pair;
a third transistor having a gate coupled to a first line of the write global data I/O line pair; and
a fourth transistor having a gate coupled to a second line of the write global data I/O line pair.

* * * * *

UNITED STATES PATENT AND TRADEMARK OFFICE
CERTIFICATE OF CORRECTION

| | | |
|---|---|---|
| PATENT NO. | : 7,184,347 B2 | Page 1 of 1 |
| APPLICATION NO. | : 11/186691 | |
| DATED | : February 27, 2007 | |
| INVENTOR(S) | : Lee et al. | |

It is certified that error appears in the above-identified patent and that said Letters Patent is hereby corrected as shown below:

<u>Column 11,</u>

Lines 4 and 17: Please Correct "110" to read --I/O--

Signed and Sealed this

Twenty-sixth Day of February, 2008

JON W. DUDAS
*Director of the United States Patent and Trademark Office*